(12) United States Patent
Roger

(10) Patent No.: US 8,433,745 B2
(45) Date of Patent: Apr. 30, 2013

(54) SCALABLE COST FUNCTION GENERATOR AND METHOD THEREOF

(75) Inventor: Frederic Roger, Santa Clara, CA (US)

(73) Assignee: Scintera Networks, Inc., Sunnyvale, CA (US)

( * ) Notice: Subject to any disclaimer, the term of this patent is extended or adjusted under 35 U.S.C. 154(b) by 1128 days.

(21) Appl. No.: 12/340,307

(22) Filed: Dec. 19, 2008

(65) Prior Publication Data

US 2010/0156471 A1  Jun. 24, 2010

(51) Int. Cl.
*G06G 7/02* (2006.01)

(52) U.S. Cl.
USPC .......................................................... 708/819

(58) Field of Classification Search ................... 708/819
See application file for complete search history.

(56) References Cited

U.S. PATENT DOCUMENTS

| | | |
|---|---|---|
| 3,706,048 A | 12/1972 | Johnston |
| 4,398,153 A | 8/1983 | Rittenbach |
| 4,959,557 A | 9/1990 | Miller |
| 5,059,927 A | 10/1991 | Cohen |
| 5,978,662 A | 11/1999 | Swales |
| 6,798,843 B1 | 9/2004 | Wright et al. |
| 7,119,588 B2 | 10/2006 | Kelley |
| 7,129,790 B2 | 10/2006 | Midtgaard et al. |
| 7,139,544 B2 | 11/2006 | Smith et al. |
| 7,146,138 B2 | 12/2006 | Anvari |
| 7,266,351 B2 | 9/2007 | Marholev |
| 7,288,988 B2 | 10/2007 | Braithwaite |
| 7,362,821 B1 | 4/2008 | Shirali |
| 7,902,901 B1 | 3/2011 | Roger |
| 8,010,075 B1 | 8/2011 | Roger |
| 8,068,574 B2 | 11/2011 | Norris et al. |
| 8,295,394 B1 | 10/2012 | Broadwell et al. |
| 2005/0200408 A1 | 9/2005 | Benjamin et al. |
| 2008/0139119 A1* | 6/2008 | Behzad et al. ............... 455/41.2 |
| 2008/0139141 A1 | 6/2008 | Varghese et al. |
| 2009/0131006 A1 | 5/2009 | Wu |

* cited by examiner

*Primary Examiner* — Tan V. Mai
(74) *Attorney, Agent, or Firm* — Edward C. Kwok; Hogan Lovells US LLP

(57) ABSTRACT

A cost function generator circuit includes memory terms each receiving one or more input signals, and each providing inphase and quadrature output current signals. The inphase and quadrature output currents of the memory terms are summed to provide combined inphase and quadrature output currents, respectively. Transimpedance amplifiers are provided to transform the combined inphase and quadrature output currents into an inphase output voltage and a quadrature output voltage.

18 Claims, 3 Drawing Sheets

US 8,433,745 B2

SCALABLE COST FUNCTION GENERATOR AND METHOD THEREOF

CROSS REFERENCE TO RELATED APPLICATIONS

The present patent application is related to U.S. patent applications (the "Copending Applications"): (a) Ser. No. 12/037,455, entitled "High Order Harmonics Generator," which names as inventor Frederic Roger, and was filed on Feb. 26, 2008; (b) Ser. No. 12/257,292, entitled "Error Signal Formation for Linearization," which names as inventor Adric Q. Broadwell et al., and was filed on Oct. 23, 2008, now U.S. Pat. No. 8,295,394, which was issued on Oct. 23, 2012; and (c) Ser. No. 12/340,111, entitled "RF Squarer," which names as inventor Frederic Roger, and was filed on the same day as the present invention, now U.S. Pat. No. 7,902,901, which was issued on Mar. 8, 2011. The Copending Applications are hereby incorporated by reference in their entireties.

BACKGROUND OF THE INVENTION

1. Field of the Invention

The present invention relates to the high speed mixed signal integrated circuits. In particular, the present invention relates to a cost function circuit suitable for use in a pre-distorter.

2. Discussion of the Related Art

The design of a cost function circuit depends heavily on its application. Different power and die size requirements, for example, may lead to different design choices in the design of the cost function circuit. An analog cost function may be used, for example, to provide a polynomial function of a signal. Such a polynomial function may be used, for example, in a pre-distorter to implement the inverse of a channel transfer function. Typically, for use in a communication circuit (e.g., GSM with a 900 MHz carrier signal or WCDMA with a 2.0 GHz carrier signal), the bandwidth required of a cost function circuit may exceed a few hundred megahertz (MHz). In addition, unlike an implementation in a digital circuit (e.g., digital signal processor, or DSP), a mixed signal cost function generator circuit has to contend with variations due to process, variation and temperature (PVT) and other non-ideal properties. These requirements pose significant challenges to a cost function generator circuit design.

SUMMARY

According to one embodiment of the present invention, a cost function generator circuit includes memory terms each receiving one or more input signals, and each providing inphase and quadrature output current signals. The inphase and quadrature output currents of the memory terms are summed to provide combined inphase and quadrature output currents, respectively. Transimpedance amplifiers are provided to transform the combined inphase and quadrature output currents into an inphase output voltage and a quadrature output voltage.

In one embodiment, each memory term include (a) programmable delay elements which provide a programmable delay to each of the input signals; (b) analog multipliers which receive the delayed input signals to generate harmonics of the delayed input signals; (c) filters that attenuate dc offsets and high frequency components from the harmonics; (d) digital-to-analog converters, each of which converting a digital value into an analog value; and (e) analog multipliers for multiplying the analog values with corresponding harmonics to provide a product. The products are summed to provide the inphase and quadrature output currents of the memory term.

In one embodiment, an analog multiplier and a digital-to-analog converter are implemented together as a combined digital-to-analog converter and multiplier. That implementation includes (a) current sources that provide first and second load currents; (b) a first stage receiving the first and second load currents, the first stage including a first 2-quadrant analog multiplier and a second 2-quadrant analog multiplier, the first stage receiving a corresponding harmonic; and (c) a second stage including 2-quadrant analog multipliers each connected to the first and second 2-quandrant analog multipliers of the first stage to form a 4-quadrant analog multiplier, with each 2-quadrant analog multiplier of the second stage receiving a decoded bit of a corresponding digital value.

In one embodiment of the present invention, the load currents are each compensated for variations in PVT. Each analog multiplier of the cost function generator circuit has an individually programmable gain.

The present invention is better understood upon consideration of the detailed description below in conjunction with accompanying drawings.

DETAILED DESCRIPTION OF THE PREFERRED EMBODIMENTS

Figure 1:
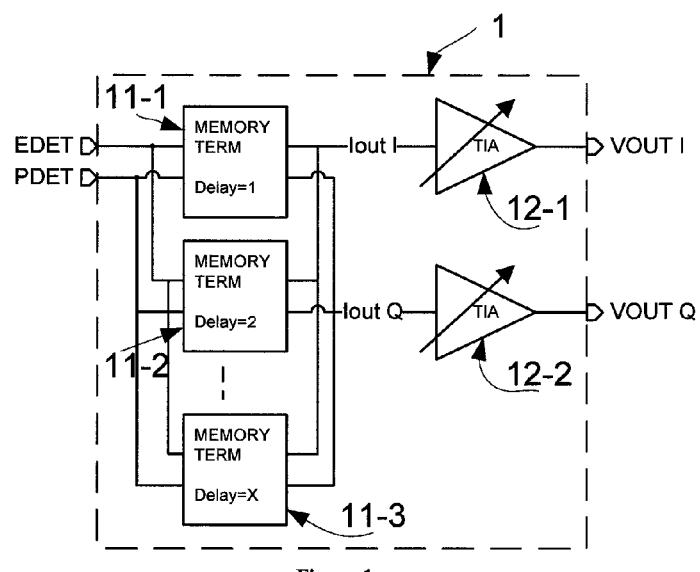
FIG. 1 shows cost function circuit 1, in accordance with one embodiment of the present invention.

FIG. 1 shows cost function generator circuit 1, in accordance with one embodiment of the present invention. Cost function generator circuit 1 may be used, for example, in an amplitude modulation (AM) communication system. As shown in FIG. 1, cost function generator circuit 1 receives as input an envelope signal denoted by EDET and a power signal (i.e., the square of the envelope signal) denoted by PDET, and provides as output quadrature output signals VOUT I and VOUT Q. Cost function circuit 1 includes a number of memory terms 11-1 to 11-$m$ (e.g., eleven terms), each corresponding to a different predetermined programmable delay. In FIG. 1, the predetermined programmable delays of memory terms 11-1 to 11-$m$ may be integer multiples of a predetermined delay value (e.g., 1 nanosecond). Memory terms 11-1 to 11-$m$ each contribute inphase and quadrature current signals that are respectively summed with the inphase and quadrature current signals of all the other memory terms to provide output current signals Iout P and Iout Q at the input terminals of transimpedance amplifier (TIA) 12-1 and TIA 12-2. TIA 12-1 and TIA 12-2 transform output current signals Iout P and Iout Q into voltage signals VOUT I and VOUT Q.

Figure 2:
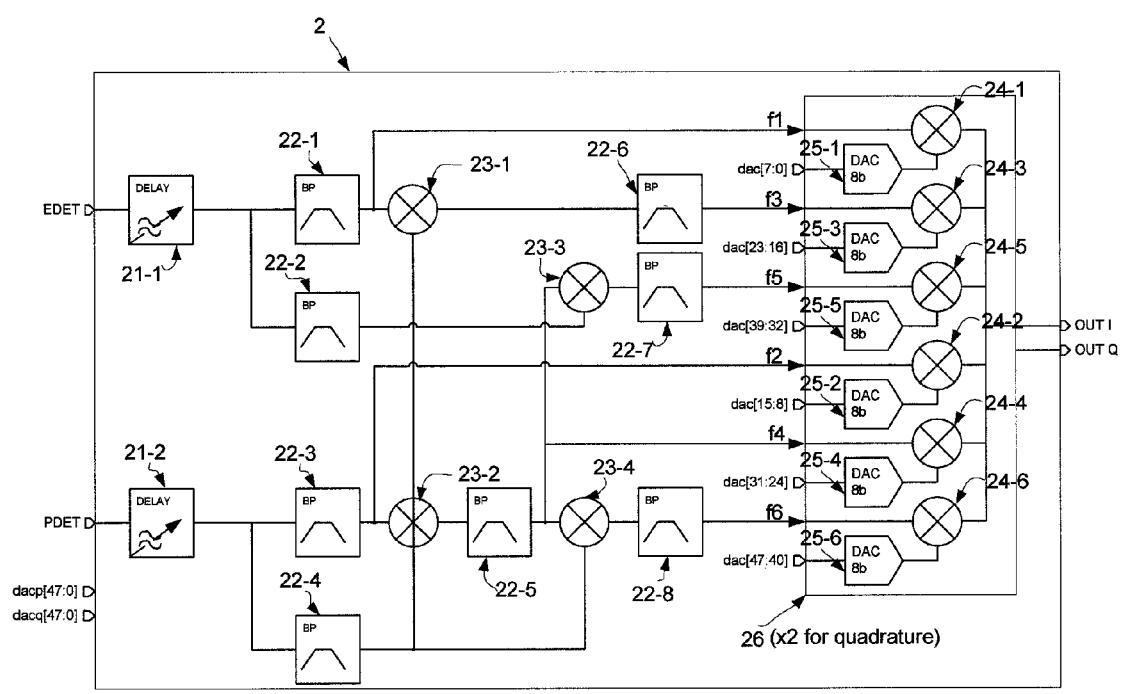
FIG. 2 shows memory term 2, in accordance with one embodiment of the present invention.

FIG. 2 shows memory term 2, in accordance with one embodiment of the present invention. Memory term 2 may be used to implement any of memory terms 11-1 to 11-$m$ of FIG. 1. As shown in FIG. 2, memory term 2 is programmed by specifying six 8-bit coefficients in 48-bit word dacp[47:0] for the inphase current signal Iout P and specifying another six 8-bit coefficients in 48-bit word dacq[47:0] for the quadrature current signal Iout Q. Envelope signal EDET and power signal PDET are respectively delayed by programmable predetermined delays 21-1 and 21-2 and filtered by analog programmable band pass filters 22-1 and 22-3 to provide signals f1 and f2, respectively. Delay elements 21-1 and 21-2 may each be implemented by a single-pole, passive RC circuit, for example. The delayed envelope signal may be represented by the function $x(t-\tau)$, where t is time and $\tau$ is the programmable delay. Signal f1 is the first harmonic. Then, the delayed power signal may be represented by the function $(x(t-\tau))^2$, or the second harmonic. Analog programmable band pass filters 22-1 and 22-3 eliminate any DC offset in the signals f1 and f2, and any residual high frequency components of the carrier signal. In this embodiment, band pass filters 22-1 to 22-8 each use the input parasitic impedance at the input terminal of a corresponding one of multipliers 23-1 to 23-4 and 24-1 to 24-6 to provide the low-pass characteristic. Each multiplier has an individually adjusted gain, which is actively compensated for PVT.

Signal f1 is multiplied at analog multiplier 23-1 with delayed power signal PDET (after filtering by analog band pass filter 22-4) to provide signal f3, after filtering at analog programmable band pass filter 22-6. Signal f3 corresponds to the $(x(t-\tau))^3$ term of the polynomial function (i.e., the third harmonic). Signal f2 is multiplied at analog multiplier 23-2 with delayed power signal PDET (after filtering by band pass filter 22-4) to provide signal f4, after filtering at analog programmable band pass filter 22-5. Signal f4 corresponds to the $(X(t-\tau))^4$ term of the polynomial function (i.e., the fourth harmonic). Signal f4 is multiplied at analog multiplier 23-3 with delayed envelope signal EDET (after filtering by analog programmable band pass filter 22-2) to provide signal f5, after filtering at analog band pass filter 22-7. Signal f5 corresponds to the $(X(t-\tau))^5$ term of the polynomial function (i.e., the fifth harmonic). Signal f4 is also multiplied at analog multiplier 23-4 with the delayed power signal PDET to provide signal f6, after filtering at analog band pass filter 22-8. Signal f6 corresponds to the $(x(t-\tau))^6$ term of the polynomial function (i.e., the sixth harmonic). Signals f1 to f6 are each provided to gain control block 26, which includes an inphase portion and a quadrature portion. Inphase and quadrature portions of gain control block 26 receive the inphase coefficients dacp[47:0] and the quadrature coefficients dacq[47:0], respectively. Inphase coefficients dacp[47:0] is divided in gain control block 26 into six 8-bit coefficients dacp[7:0], dacp[15:8], dacp[23:16], dacp[31:24], dacp[39:32] and dacp[47:40], which weight the inphase portions of signals f1 to f6, respectively. Similarly, quadrature coefficients dacq[47:0] is divided in gain control block 26 into six 8-bit coefficients dacq[7:0], dacq[15:8], dacq[23:16], dacq[31:24], dacq[39:32] and dacq[47:40], which weight signals f1 to f6, respectively.

Figure 3:
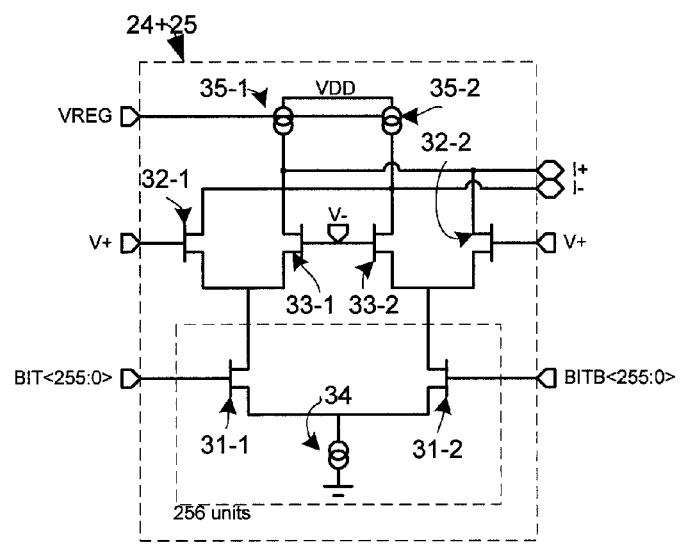
FIG. 3 shows circuit 24+25 which performs a simultaneous conversion of a digital value into analog form and multiplies the converted value to a corresponding signal, in accordance with one embodiment of the present invention.

Each 8-bit coefficient is simultaneously converted into analog form and multiplied to the corresponding signal in a combined digital-to-analog converter (DAC) 24 and analog multiplier 25. FIG. 3 shows circuit 24+25 which performs a simultaneous conversion of a digital value into analog form and multiplies the converted value to a corresponding signal, in accordance with one embodiment of the present invention. As shown in FIG. 3, circuit 24+25 is implemented by 256 differential-input 4-quadrant multipliers whose output currents are summed. For example, differential input signal V+ and V− controls 2-quadrant multipliers formed by transistors 32-1 and 33-1 and transistors 32-2 and 33-2, respectively. (This portion of the circuit 24+25 is common to all 256 multipliers.) As shown in FIG. 3, the binary-coded 8-bit coefficient is decoded into 256 bits each provided in differential form (i.e., BIT<255:0>and BITB<255:0>). Each bit controls the input terminals of a 2-quandrant multiplier formed by transistors 31-1 and 31-2. Bias voltage VREG controls the load currents in current sources 35-1 and 35-2. Signal VREG is a signal actively compensated for PVT.

Cost function generation circuit 1 is a low power design which does not require an additional gain stage. The order of the cost function is easily programmed by setting corresponding coefficients (e.g., setting some coefficients to zero to eliminate an order of the polynomial). Likewise, any of the memory terms can also be easily removed by setting their output currents to zero.

The above detailed description is provided to illustrate the specific embodiments of the present invention and is not intended to be limiting. Numerous variations and modifications within the scope of the present invention are possible. The present invention is set forth in the following claims.

I claim:

1. A cost function generator circuit, comprising:
    a plurality of memory terms each receiving one or more input signals, and each providing inphase and quadrature output currents corresponding to a delay relative to the input signals, wherein the delay of each memory term is different from the delays of the other memory terms, wherein the inphase output currents of the memory terms are summed to provide a combined inphase output current, and wherein the quadrature output currents of the memory terms are summed to provide a combined quadrature output current; and
    transimpedance amplifier means receiving the combined inphase output current and the combined quadrature output current to provide an inphase output voltage and a quadrature output voltage.

2. A cost function generator circuit as in claim 1, wherein each memory term comprises:
    one or more delay elements each providing a programmable delay, the delay elements implementing the corresponding delay of the memory term;
    a first plurality of multipliers receiving the delayed input signals to generate a plurality of harmonics of the delayed input signals;
    a plurality of filters that attenuate dc offsets and high frequency components from the harmonics;
    a plurality of digital-to-analog converters each converting a digital value into an analog value; and
    a second plurality of multipliers each multiplying a selected one of the analog value with a corresponding one of the harmonics to provide a product, wherein a first group of selected products are summed to provide the inphase output current of the memory term, and a second group of selected products are summed to provide the quadrature output current of the memory term.

3. A cost function generator as in claim 2, wherein each of the second plurality of multipliers and a corresponding one of the digital analog converters are implemented by a combined digital-to-analog converter and multiplier.

4. A cost function generator circuit as in claim 3, wherein the combined digital-to-analog converter and multiplier comprises:
    first and second current sources providing first and second load currents;
    a first stage receiving the first and second load currents, the first stage comprising a first 2-quadrant analog multiplier and a second 2-quadrant analog multiplier, the first stage receiving the corresponding harmonic; and
    a second stage comprising a plurality of 2-quadrant analog multipliers each connected to the first 2-quadrant analog multiplier of the first stage and the second 2-quadrant multiplier of the second stage to form a 4-quadrant analog multiplier, each 2-quadrant analog multiplier of the second stage receiving a decoded bit of a corresponding digital value.

5. A cost function generator as in claim 4, wherein the first and second load currents are each compensated for variations in PVT.

6. A cost function generator as in claim 2, wherein each of the first and second pluralities of multipliers has an individually programmable gain.

7. A cost function generator as in claim 2, wherein selected ones of the filters are each coupled to a selected one of the first plurality of analog multipliers, such that each selected filter attenuates the high frequency components by an input parasitic impedance of the coupled analog multiplier.

8. A cost function generator as in claim 2, wherein the delay elements each comprise a passive circuit including at least one pole.

9. A cost function generator as in claim 1, wherein the transimpedance amplifier means comprises a first transimpedance amplifier and a second transimpedance amplifier.

10. A method for generating a cost function, comprising:
in a plurality of memory terms each receiving one or more input signals, providing from each memory term inphase and quadrature output currents corresponding to a delay relative to the input signals, wherein the inphase output currents of the memory terms are summed to provide a combined inphase output current, and wherein the quadrature output currents of the memory terms are summed to provide a combined quadrature output current; and
using transimpedance amplifier means, which receives the combined inphase output current and the combined quadrature output current, providing an inphase output voltage and a quadrature output voltage.

11. A method as in claim 10, further comprising carrying out in each memory term:
in one or more delay elements, providing a programmable delay, the delay elements implementing the corresponding delay of the memory term;
in each of a first plurality of multipliers receiving the delayed input signals, generating a plurality of harmonics of the delayed input signals;
in each of a plurality of filters, attenuating dc offsets and high frequency components from the harmonics;
in each of a plurality of digital-to-analog converters, converting a digital value into an analog value; and
in each of a second plurality of multipliers, multiplying a selected one of the analog value with a corresponding one of the harmonics to provide a product, wherein a first group of selected products are summed to provide the inphase output current of the memory term, and a second group of selected products are summed to provide the quadrature output current of the memory term.

12. A method as in claim 11, wherein each of the second plurality of multipliers and a corresponding one of the digital analog converters are implemented by a combined digital-to-analog converter and multiplier.

13. A method as in claim 12, further comprising, in the combined digital-to-analog converter and multiplier:
providing first and second load currents in first and second current sources;
providing a first stage receiving the first and second load currents, the first stage comprising a first 2-quadrant analog multiplier and a second 2-quadrant analog multiplier, the first stage receiving the corresponding harmonic; and
providing a second stage comprising a plurality of 2-quadrant analog multipliers each connected to the first 2-quadrant analog multiplier of the first stage and the second 2-quadrant multiplier of the second stage to form a 4-quadrant analog multiplier, each 2-quadrant analog multiplier of the second stage receiving a decoded bit of a corresponding digital value.

14. A method as in claim 13, wherein the first and second load currents are each compensated for variations in PVT.

15. A method as in claim 11, wherein each of the first and second pluralities of multipliers has an individually programmable gain.

16. A method as in claim 11, wherein selected ones of the filters are each coupled to a selected one of the first plurality of analog multipliers, such that each selected filter attenuates the high frequency components by an input parasitic impedance of the coupled analog multiplier.

17. A method as in claim 11, wherein the delay elements each comprise a passive circuit including at least one pole.

18. A method as in claim 10, wherein the transimpedance amplifier means comprises a first transimpedance amplifier and a second transimpedance amplifier.

* * * * *